United States Patent
Wattyn

(10) Patent No.: US 12,023,907 B2
(45) Date of Patent: Jul. 2, 2024

(54) APPARATUS AND METHOD FOR TREATING A RELIEF PRINTING PLATE PRECURSOR WITH LIQUID

(71) Applicant: XEIKON PREPRESS N.V., Ypres (BE)

(72) Inventor: Bart Marc Luc Wattyn, Dentergem (BE)

(73) Assignee: XSYS PREPRESS N.V., Ypres (BE)

( * ) Notice: Subject to any disclaimer, the term of this patent is extended or adjusted under 35 U.S.C. 154(b) by 75 days.

(21) Appl. No.: 17/600,374

(22) PCT Filed: Apr. 9, 2020

(86) PCT No.: PCT/EP2020/060167
§ 371 (c)(1),
(2) Date: Sep. 30, 2021

(87) PCT Pub. No.: WO2020/208145
PCT Pub. Date: Oct. 15, 2020

(65) Prior Publication Data
US 2022/0161548 A1     May 26, 2022

(30) Foreign Application Priority Data
Apr. 11, 2019 (NL) .................................... 2022926

(51) Int. Cl.
*B41F 35/00* (2006.01)
*B41N 3/00* (2006.01)
*G03F 7/30* (2006.01)

(52) U.S. Cl.
CPC ............ *B41F 35/001* (2013.01); *B41N 3/006* (2013.01); *B41P 2235/22* (2013.01); *G03F 7/3057* (2013.01)

(58) Field of Classification Search
CPC ...... B41F 35/001; B41N 3/006; B41P 2235/22
(Continued)

(56) References Cited

U.S. PATENT DOCUMENTS 10,691,021 B2 * 6/2020 Dietz .................... B41C 1/1008
2016/0229172 A1 * 8/2016 Stebani .................. G03F 7/092

FOREIGN PATENT DOCUMENTS

| CN | 206037601 U | 3/2017 |
| CN | 206373096 U | 8/2017 |

(Continued)

OTHER PUBLICATIONS

International Search Report and Written Opinion for the International Patent Application No. PCT/EP2020/060167, mailed Jul. 14, 2020, 13 pages.

*Primary Examiner* — Christopher E Mahoney
*Assistant Examiner* — Marissa Ferguson-Samreth
(74) *Attorney, Agent, or Firm* — KDW Firm PLLC

(57) ABSTRACT

An apparatus for treating a relief precursor having a back side and a relief side. The apparatus includes a housing, a treating means for treating the relief precursor with at least one liquid, a removal means for removing debris and/or liquid from the relief precursor, the removal means arranged downstream of the treating means, and a conveying mechanism configured for transporting the relief precursor in a transport direction through the housing. The removal means includes a liquid removal and guidance body mounted for removing liquid from the back side of the relief precursor. The conveying mechanism is configured for pulling the relief precursor over and against said liquid removal and guidance body whilst the relief precursor is moved in the transport direction, such that in operation liquid is removed from the back side.

15 Claims, 10 Drawing Sheets

(58) Field of Classification Search
IPC ...... B41F 35/001; B41N 3/006; B41P 2235/22
; G03F 7/3057
See application file for complete search history.

(56) References Cited

FOREIGN PATENT DOCUMENTS

| | | | |
|---|---|---|---|
| CN | 209110785 | * | 7/2019 |
| DE | 4231102 | * | 3/1994 |
| DE | 4231102 A1 | | 3/1994 |
| DE | 19600846 C1 | | 4/1997 |
| EP | 0225678 A1 | | 6/1987 |
| GB | 2306697 | * | 5/1997 |
| GB | 2306697 A | | 5/1997 |
| WO | 9214864 | * | 2/1992 |
| WO | 2015044437 A1 | | 4/2015 |
| WO | 2016026499 A1 | | 2/2016 |
| WO | 2016030450 A1 | | 3/2016 |
| WO | 2017207006 A1 | | 12/2017 |
| WO | 2019110814 A1 | | 6/2019 |

* cited by examiner

APPARATUS AND METHOD FOR TREATING A RELIEF PRINTING PLATE PRECURSOR WITH LIQUID

This is a national stage application filed under 35 U.S.C. § 371 of pending international application PCT/EP2020/060167, filed Apr. 9, 2020, which claims priority to Netherlands Patent Application No. NL 2022926, filed Apr. 11, 2019, the entirety of which applications are hereby incorporated by reference herein.

FIELD OF INVENTION

The field of the invention relates to apparatus and methods for treating a relief precursor, in particular a printing plate precursor, with liquid.

BACKGROUND

Relief structures can be made by transfer of image information onto an imageable layer and removing parts of the imageable layer. The formed relief may then be used to transfer the information in a printing step onto a substrate. An example of a relief precursor is a printing plate precursor. Digitally imageable flexible printing plate precursors are known, and typically comprise at least a dimensionally stable support layer, a photopolymerizable layer and a digitally imageable layer. The digitally imageable layer may be e.g. a laser-ablatable layer. In case of conventional printing plate precursors, the digitally imageable layer is replaced by a mask which is attached to a photopolymerizable layer.

To produce a printing plate from a printing plate relief precursor, according to existing methods, first a mask is written into the digitally imageable layer based on image data to be printed. Following the writing of the mask, the plate is exposed through the mask with radiation such that the photopolymerizable layer undergoes polymerization in the regions which are not covered by the mask. Following the exposure, the residues of the mask and of the non-polymerized portions have to be removed. This may be done with one or more liquids in a washer apparatus, typically comprising a plurality of brush washers.

Washer apparatus for printing plate precursors are known. Typically, a transport bar is used to move a printing plate precursor through such a washer apparatus. To that end a leading edge of the printing plate precursor is coupled to the transport bar. The transport bar with the coupled plate is brought to an inlet port of the washer apparatus. The transport bar leaves the washer apparatus at an outlet port, where it is recuperated for further treatment. This further treatment may consist in placing the printing plates in an oven. When placed in an oven, the printing plate is typically supported on the backside thereof. When liquid remains present on the backside of the printing plate, an overpressure may be generated due to the formation of gas bubbles in the oven. This may damage the printing plate. In addition, the drying time in the oven is prolonged as more liquid needs to be removed. The liquids may comprise organic solvents, which may generate vapors, especially when the reliefs are dried. The release of such vapors (VOC Volatile Organic Content) to the environment must be limited and therefore it is advantageous when the reliefs carry as little liquid as possible when they enter the drying section.

WO 2016/030450 A1 discloses an apparatus for producing flexographic printing plates comprising:

an exposure unit (1) for the preliminary exposure,
an exposure unit (2) for the main exposure,
a washout unit (5) for removing the residues of the digitally imaged layer and also the unpolymerized fractions of the relief-forming layer, using washout media,
a drying unit (7) for drying the washed out flexographic printing plates,
a post-treatment unit (9) for post-treating the dried flexographic printing plates with UVA and/or UVC light, and
a storage unit (10) for accommodating the completed flexographic printing plates.

DE 4231102 A1 discloses in FIG. 1 a device 1 for washing out, drying and post-treating flexographic printing plates. A printing plate 2 is introduced in the direction of the arrow E into a washing out segment P. The printing plate 2 at this time passes between rotating brush rolls 3 and a revolving belt 4 which is guided via two turning rolls, 5, 6 in the form of an endless loop. The brush rolls 3 dip into a basin 8 containing washing fluid, and transport the washing fluid out of the basin 8 onto the printing plate 2. The printing plate 10 runs through an intermediate roll 16 with the aid of which small differences in height between the position of the printing plate 10 in the wash out segment P and in the target position in the drying segment T can be equalized. In the drying segment T the printing plate, here denoted by 10', is guided to another conveyor belt 17. The printing plate 10' is now exposed to the cross air stream shown schematically by arrows 20 which is generated by a blower 21.

SUMMARY

The object of embodiments of the invention is to provide apparatus and methods for treating a relief precursor allowing for an improved liquid removal of the back side of the relief precursor.

According to a first aspect of the invention there is provided an apparatus for treating a relief precursor having a back side and a relief side. The apparatus comprises a housing, at least one compartment to hold at least one liquid, a treating means for treating the relief precursor with the at least one liquid, a removal means for removing debris and/or liquid from the relief precursor, and a conveying mechanism configured for transporting the relief precursor in a transport direction through the housing. The treating means is arranged in the housing. The removal means is arranged downstream of the treating means. The removal means comprises a liquid removal and guidance body mounted for removing liquid from the back side of the relief precursor. The conveying mechanism is configured for pulling the relief precursor over and against the liquid removal and guidance body whilst the relief precursor is moved in the transport direction, such that liquid is removed from the back side of the relief precursor.

By providing such a removal means downstream of the treating means, liquid can be efficiently removed from the backside of the relief precursor in a simple and robust manner, and can be guided away over a surface of the liquid removal and guidance body. Indeed, the liquid removal and guidance body can have a simple shape, and the conveying mechanism can be easily configured to pull the relief precursor over and against the liquid removal and guidance body. Thus, it can be avoided that any significant amounts of liquid remain present on the backside of the treated relief precursor, such that the formation of bubbles at the backside during subsequent treatment, e.g. in an oven, can be reduced or avoided. Also drying times are shortened and VOC is reduced.

Preferably, the conveying mechanism is configured for transporting the relief precursor at a first transport level upstream of the liquid removal and guidance body and at a second transport level downstream of the liquid removal and guidance body. The first and the second transport level may be the same or different, i.e. the relief precursor may be transported at the same height before and after the liquid removal and guidance body or at a different height. At least one of the first and second transport level is lower than a top edge of the liquid removal and guidance body. In that manner the relief precursor will move upwardly when arriving at the liquid removal and guidance body and/or move downwardly when leaving the liquid removal and guidance body.

Preferably, the liquid removal and guidance body is made of metal. A metal body has the advantage that it is robust and that it can withstand aggressive liquids.

Preferably, the liquid removal and guidance body is arranged to be substantially stationary when in operation. This will further enhance the liquid removal.

According to an exemplary embodiment, the surface of the liquid removal and guidance body slopes upwardly in the transport direction between a first line and the top edge. In that manner, the relief precursor can be smoothly guided along the surface whilst at the same time allowing for a good liquid removal.

Preferably, the angle of the slope at the top edge is smaller than 20°. In that manner, there can be a smooth conversion from the first transport level to the second transport level.

Preferably, the angle of the slope gradually decreases from the first line to the top edge.

According to another exemplary embodiment, the surface of the liquid removal and guidance body slopes downwardly in the transport direction between the top edge and a second line. In that manner, the relief precursor can be smoothly guided along the surface whilst at the same time allowing for a good liquid removal.

Preferably, the angle of the slope at the top edge is smaller than 20°. In that manner, there can be a smooth conversion from the first transport level to the second transport level.

Preferably, the angle gradually increases from the top edge to the second line.

According to an exemplary embodiment, the conveying mechanism is configured to pull the relief precursor in a tensioned state through the housing and over the liquid removal and guidance body. In that manner, the relief precursor can be in tight contact with the liquid removal and guidance body, further enhancing the liquid removal. The relief precursor may be supported on a plurality of bases as it is pulled though the apparatus. For example, there may be provided a plurality of tables or a perforated plate in the housing on which the relief precursor is supported whilst being treated by the treating means.

According to an exemplary embodiment, the distance between the top edge and the first or second transport level is in the range of 0.1 to 10 mm, preferably 0.5 to 8 mm, more preferably 0.5 to 5 mm, most preferably 1 to 5 mm. In other words, the distance may be relatively small, such that the transport through the apparatus is not significantly hindered by the liquid removal and guidance body.

Preferably, the liquid removal and guidance body extends in a direction substantially perpendicular on the transport direction and parallel to the first and second transport level.

Preferably, the liquid removal and guidance body is configured and mounted to be in contact with substantially the entire width of the relief precursor.

Preferably, the liquid removal and guidance body is any one of the following: a rod, a bar, a plate, a blade. Such bodies have the advantage that they are robust and cheap, and can be easily arranged in the apparatus.

Preferably, the liquid removal and guidance body is made of a corrosion and/or solvent resistant material. The liquid removal and guidance body may be made of a metal, such as a stainless steel, a polymer, a polymer blend, a rubber, a ceramic, a glass or combinations thereof.

Preferably, the cross section of the liquid removal and guidance body is a line, a curve, a rectangle, a triangle, a circle, a partial circle, an ellipse, a partial ellipse, a polygonal shape with at least one rounded or one sharp edge. The surface of the liquid removal and guidance body which is intended to be in contact with the relief precursor may be a curved or a flat surface Preferably, the liquid removal and guidance body is a fixedly mounted or spring-mounted stationary body. In other words, the liquid removal and guidance body is preferably non-rotatable.

According to a preferred embodiment, the surface of the liquid removal and guidance body which is intended to be in contact with the relief precursor is curved and has a rounded upper edge, and the radius of curvature of the rounded upper edge is in the range of 0.1 to 20 mm, preferably 5 to 15 mm. This will allow for a very smooth passage of the relief precursor over the liquid removal and guidance body, whilst at the same time allowing a good guidance of the removed liquid over the surface.

According to an exemplary embodiment, the removal means further comprises at least one lower removal roll arranged to rotate in contact with the back side of the relief precursor, said at least one lower removal roll being arranged upstream of the liquid removal and guidance means. Also, the removal means may further comprise at least one upper removal roll arranged to rotate in contact with the relief side of the relief precursor, said at least one upper removal roll being arranged upstream of the liquid removal and guidance means.

Preferably, the at least one upper removal roll is arranged opposite the at least one lower removal roll, on opposite sides of the transport level.

Preferably, each lower and/or upper removal roll is provided with a doctor blade or other means to remove debris therefrom.

The at least one upper and/or lower removal roll may comprise a brush roll and/or a cloth roll. By using different rolls, the liquid can be removed in steps, comparable to how debris/liquid is removed in a "car wash" system.

Optionally, the removal means further comprise a liquid application means to apply additional liquid, e.g. by spraying, on the at least one upper and/or lower removal roll in order to promote the removal of debris from the relief precursor.

According to an exemplary embodiment, the first and second transport levels extend in a horizontal plane. So, when the relief precursor passes over the surface of the liquid removal and guidance body, it may be moved upward and/or downward to pass from the first to the second transport level. It is noted that the first transport level may extend in a horizontal plane in the housing, and that the second transport level may extend in a horizontal plane or in an inclined plane downstream of the liquid removal and guidance body.

According to an exemplary embodiment, the apparatus according to any preceding claim comprises a removal means, which has a smooth surface. The roughness of a top surface of the liquid removal and guidance body is lower than Ra 3.5 μm when measured according to ISO 4287: 1997. Preferably Ra is lower than 3 μm, more preferably lower than 2.8 μm, most preferably lower than 2.5 μm.

According to an exemplary embodiment, the apparatus further comprises adjustment means configured for adjusting the elevation level of the liquid removal and guidance body. In that manner, the height of the surface of the liquid removal and guidance body can be adjusted in function of the type of precursor and/or in function of the amount of liquid remaining on the relief precursor. The adjustment means may also be used to move the liquid removal and guidance body out of the way for the short time during which the transport bar passes it.

According to an exemplary embodiment, the removal means further comprises a reservoir arranged for collecting liquid removed by the liquid removal and guidance body. The collected liquid may optionally be re-used.

According to an exemplary embodiment, the housing has an entrance port and an exit port which are located at opposite sides of the housing seen in the transport direction. The first transport level extends between the entrance port and the liquid removal and guidance body. Preferably, the liquid removal and guidance body is located right before the exit port or at the exit port.

According to an exemplary embodiment, the at least one liquid compartment comprises at least two liquid compartments for at least two liquids, said at least two liquids being the same or different. The nature of the at least one liquid used may be chosen in function of the relief precursor to be treated. For example aqueous wash-out media and/or organic wash-out media or combinations thereof may be used.

The conveying mechanism may be provided with a transport bar configured to be coupled to a leading edge of the relief precursor, wherein the conveying mechanism is configured to pull the transport bar with the coupled relief precursor over the liquid removal and guidance body.

According to an exemplary embodiment, the conveying mechanism is selected from a group comprising at least one of: an endless belt, an endless chain, a lead screw, a linear motor, a movable means with suction means, or combinations thereof. When the conveying mechanism comprises two lead screws, the end portions of the transport bar may be provided with dents adapted to be coupled to the lead screws.

According to an exemplary embodiment, the treating means is configured for treating the relief side and/or the back side of the relief precursor, and the treating means comprises any one or more of the following: rotating treating means, oscillating treating means, spraying means, rinsing means, or combinations thereof; and more in particular cylindrical rotating brushes, flat rotating brushes, oscillating cylindrical or flat brushes, or combinations thereof.

According to an exemplary embodiment, the apparatus further comprises a control means configured to control at least one of: the conveying mechanism, the treating means, the adjustment means and the removal means. Of course also other components of the apparatus may be controlled by the same control means or by a different control means. The control means may be connected to any components (e.g. motors, gears, sensors, pumps, light sources, switches) of the apparatus in order to get information of their status and/or to control their actions. The status information may be visualized for an operator and may be stored electronically to be able to record and analyze the data. In addition the control unit may be able to accept orders from an operator and communicate these to the different components. An order might be given as a single order or a set of orders in a certain sequence and it may be generated and stored electronically. The control means may comprise a computer or a PLC (programmable logic controller), a screen or other means for visualization, a speaker and/or a microphone or other means for acoustic signals and communication. The computer may be connected to converters which transfer the digital computer signals into analog or digital signals that may be read and understood by the components.

According to a second aspect of the invention there is provided a method for treating a relief precursor. The method comprises the following steps: providing a relief precursor with removable and non-removable material, conveying the relief precursor in a transport direction through a treatment compartment in which removable material is removed using at least one liquid, pulling the relief precursor in a transport direction over and against a surface of a liquid removal and guiding body, such that liquid is removed from the back side and carried off, preferably over the surface of the liquid removal and guiding body. Preferably, the liquid removal and guidance body is arranged to be substantially stationary whilst the relief precursor is conveyed over its surface.

Preferably, the relief precursor is pulled in a tensioned state over the liquid removal and guidance body.

Preferably, the at least one liquid comprises any one or more of the following: water, an aqueous solution, an organic solvent, a combination of organic solvents, or combinations thereof.

The features and advantages set out above for the apparatus are equally applicable for the method.

According to a preferred embodiment, the relief precursor is pulled through the housing using a transport bar. A transport bar may be provided with a plurality of coupling elements which can be coupled to a leading edge of the relief precursor. To that end there may be provided a plate coupling station at the entrance port of the housing.

Also, a plate decoupling station and a plate discharge zone may be provided. The plate discharge zone may be located between the exit port of the housing and the plate decoupling station such that a relief precursor is pulled fully out of the housing in the plate discharge zone before being decoupled from the transport bar in the plate decoupling station.

According to a preferred embodiment, the conveying mechanism comprises a forward transport mechanism configured to transport the transport bar with the coupled relief precursor at least from the entrance port to the exit port of the housing, and from the exit port to the plate decoupling station. Also, the conveying mechanism may comprise a bar coupling means configured to couple the transport bar with coupled relief precursor to the forward transport mechanism. The forward transport mechanism may comprise a first and a second forward transport mechanism extending at first and second opposite lateral sides of the housing, respectively. The first and second forward transport mechanism are configured to be coupled to a first and second end of the transport bar, respectively, and to transport the transport bar from the entrance port to the exit port whilst the first and second end of the transport bar are moved along the first and second opposite side, respectively. The use of two forward transport mechanisms has the advantage that the transport bar can be very stably transported through the housing.

According to a preferred embodiment, the first and/or second forward transport mechanism comprises a first and/or second lead screw; and the first and/or second end of the transport bar is provided with a first and/or second coupling portion configured to be coupled to the first and/or second lead screw, respectively. The use of lead screws has the advantage of allowing a simple and robust coupling and decoupling to the ends of the transport bar. According to another embodiment, the first and/or second forward transport mechanism comprises a first and/or second chain or belt or linear motor or combinations thereof; and the first and/or second end of the transport bar is provided with a first and/or second coupling portion configured to be coupled to the first and/or second chain or belt or linear motor, respectively.

Optionally, there may be provided a backward transport mechanism configured to transport the transport bar from the plate decoupling station back to the plate coupling station.

BRIEF DESCRIPTION OF THE FIGURES

The accompanying drawings are used to illustrate presently preferred non limiting exemplary embodiments of the apparatus and method of the present invention. The above and other advantages of the features and objects of the invention will become more apparent and the invention will be better understood from the following detailed description when read in conjunction with the accompanying drawings, in which.

DETAILED DESCRIPTION OF EMBODIMENTS

Figure 1A:
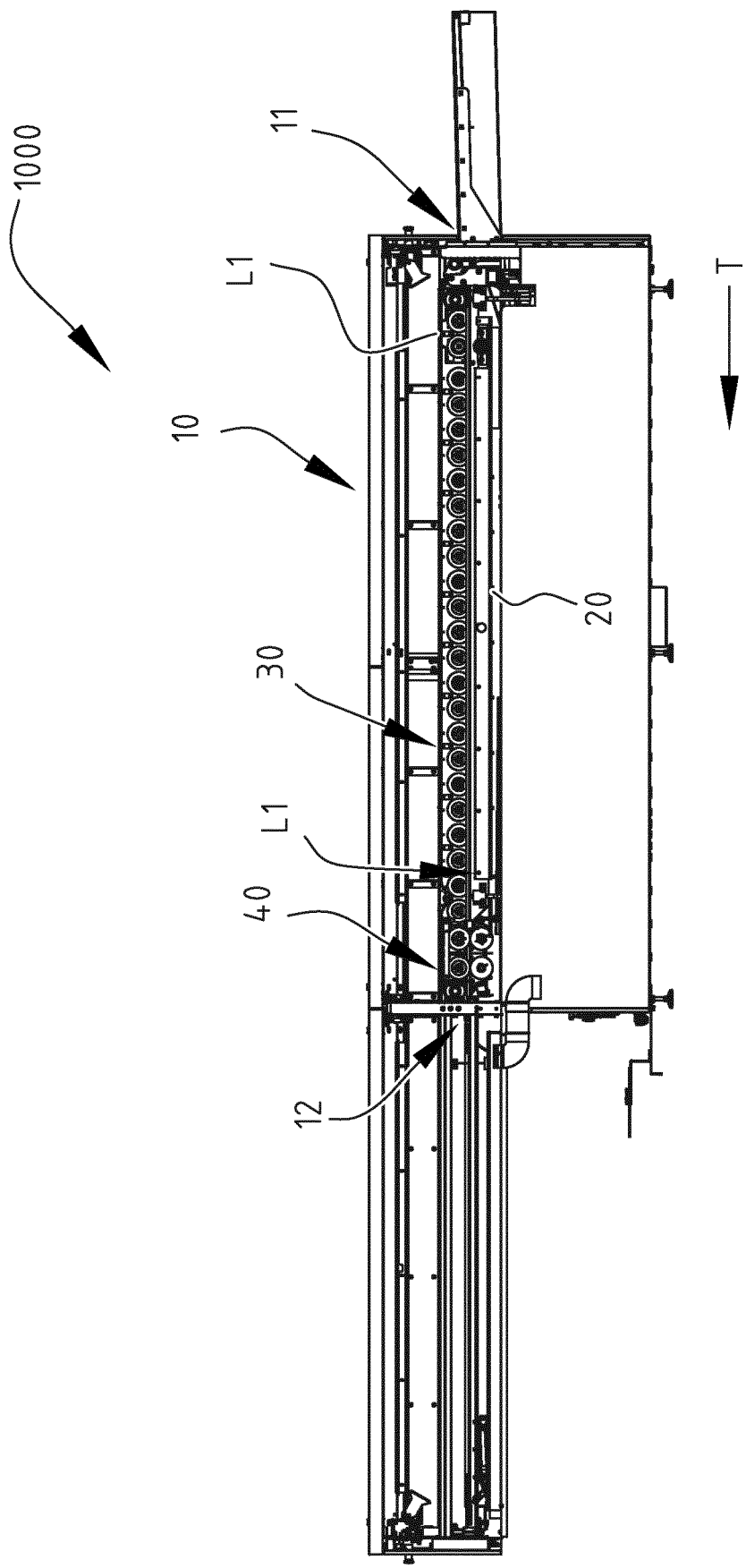
FIG. 1A is a schematic side view of the an exemplary embodiment of an apparatus for treating a relief precursor.
Figure 1B:
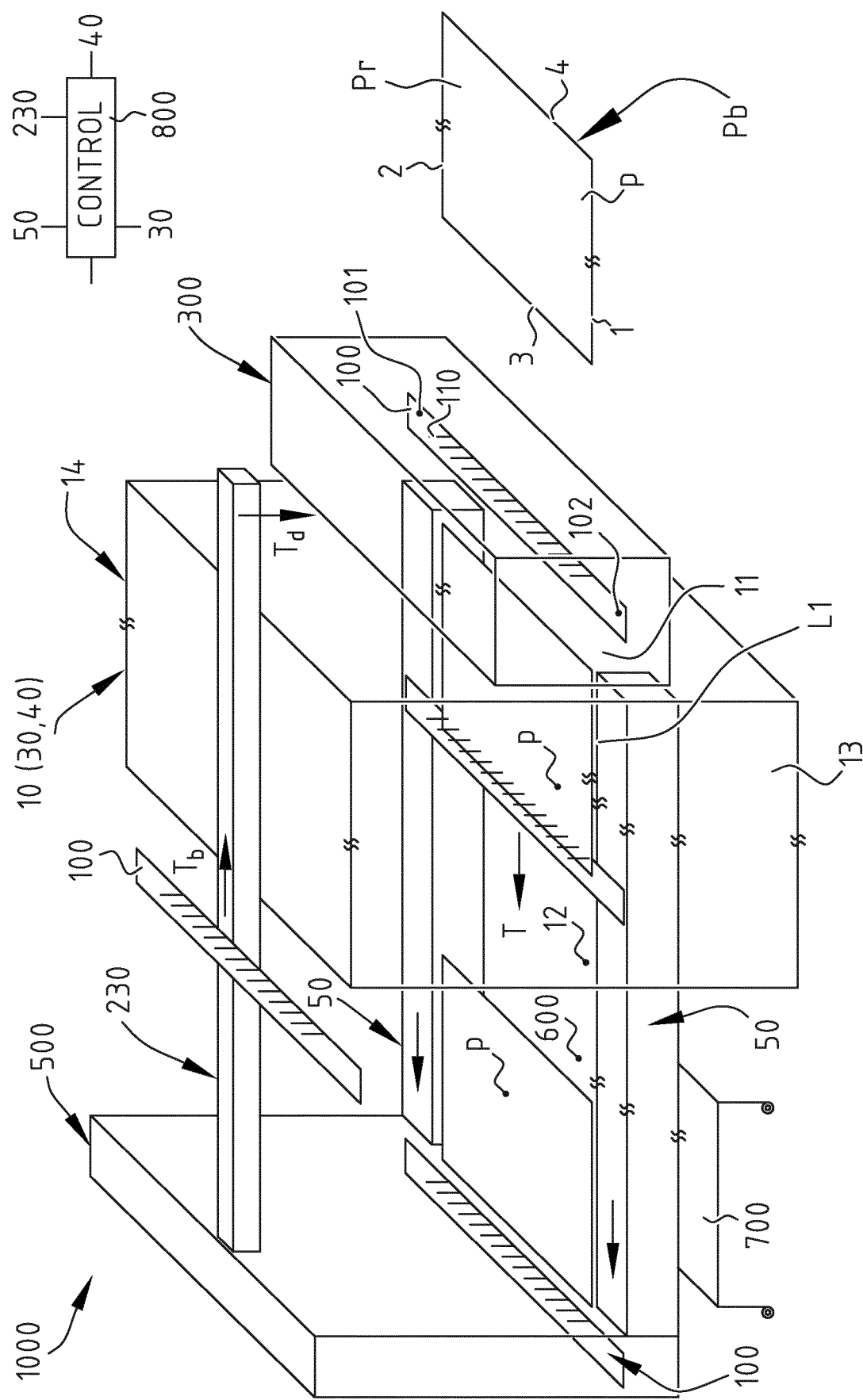
FIG. 1B is a schematic perspective view of another exemplary embodiment of an apparatus for treating a relief precursor.

FIGS. 1A and 1B illustrates schematically an apparatus 1000 for treating a relief precursor P, such as a printing plate precursor P, with at least one liquid. The apparatus 1000 is a washing apparatus for washing out a relief precursor with at least one liquid and for subsequently removing liquid and/or debris from the relief precursor. FIG. 1A shows a first exemplary embodiment and FIG. 1B shows very schematically a second exemplary embodiment in which the same or similar components have been indicated with the same reference numerals.

The apparatus 1000 comprises a housing 10, at least one compartment 20 to hold at least one liquid, a treating means 30 arranged in the housing 10 for treating the relief precursor P with the at least one liquid, and a conveying mechanism 50 (shown schematically in FIG. 1B, and shown partly in FIGS. 2 and 3) configured for transporting the relief precursor P, preferably in a tensioned state, in a transport direction T through the housing 10.

The apparatus 1000 further comprises a removal means 40 for at least partially removing debris and liquid from the relief precursor P. Preferably, the removal means 40 is arranged in the housing 10. The removal means 40 is arranged downstream of the treating means 30. The housing 10 has an entrance port 11 and an exit port 12 which are located at opposite sides of the housing 10 seen in the transport direction T. The at least one liquid compartment 20 may comprise at least two liquid compartments for at least two liquids, said at least two liquids being the same or different. The conveying mechanism 50 may be selected from a group comprising at least one endless belt, at least on endless chain, at least one lead screw (as shown in FIGS. 2 and 3), at least one linear motor, a movable means with suction means or combinations thereof.

Figure 2A:
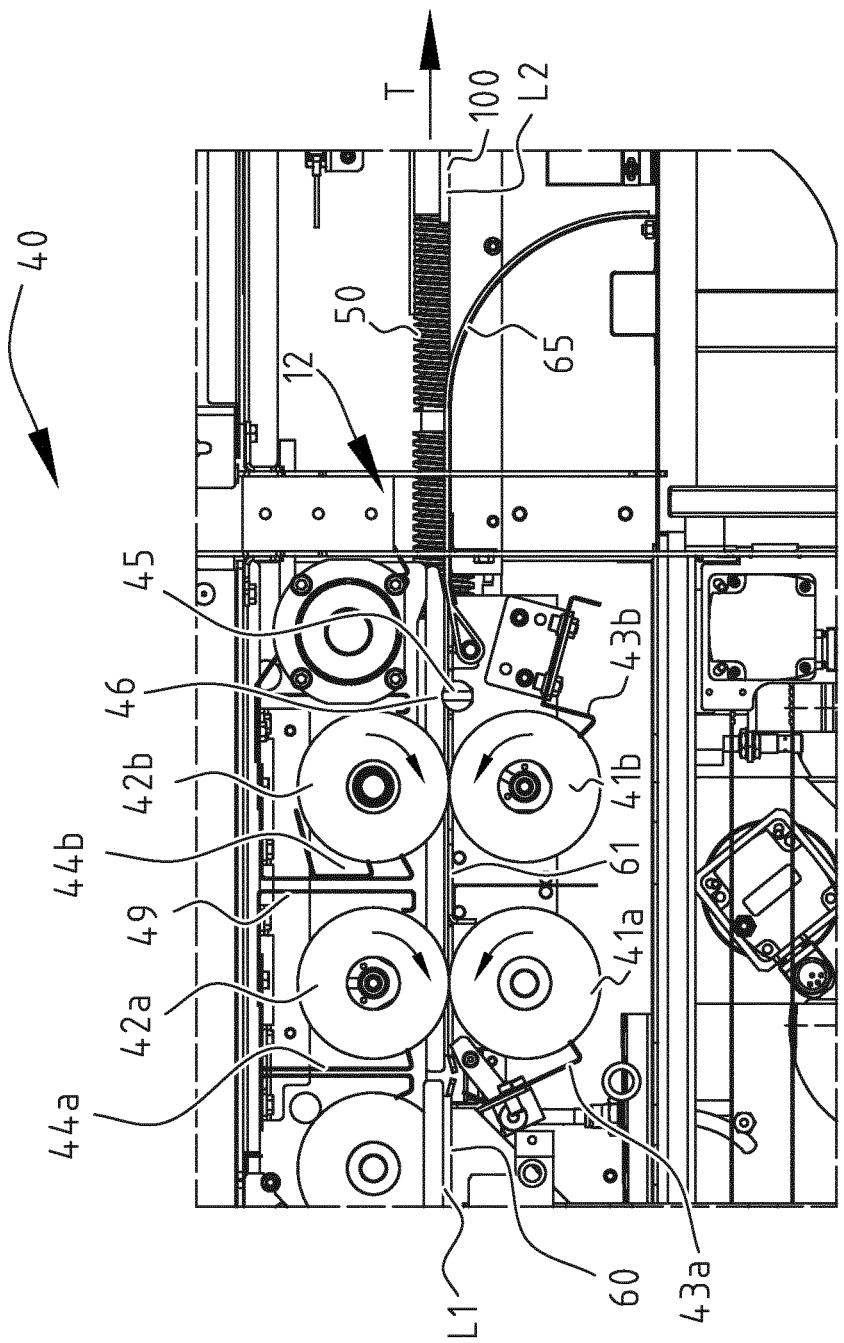
FIG. 2A is a detailed side view of the removal means of the exemplary embodiment of FIG. 1A.
Figure 2B:
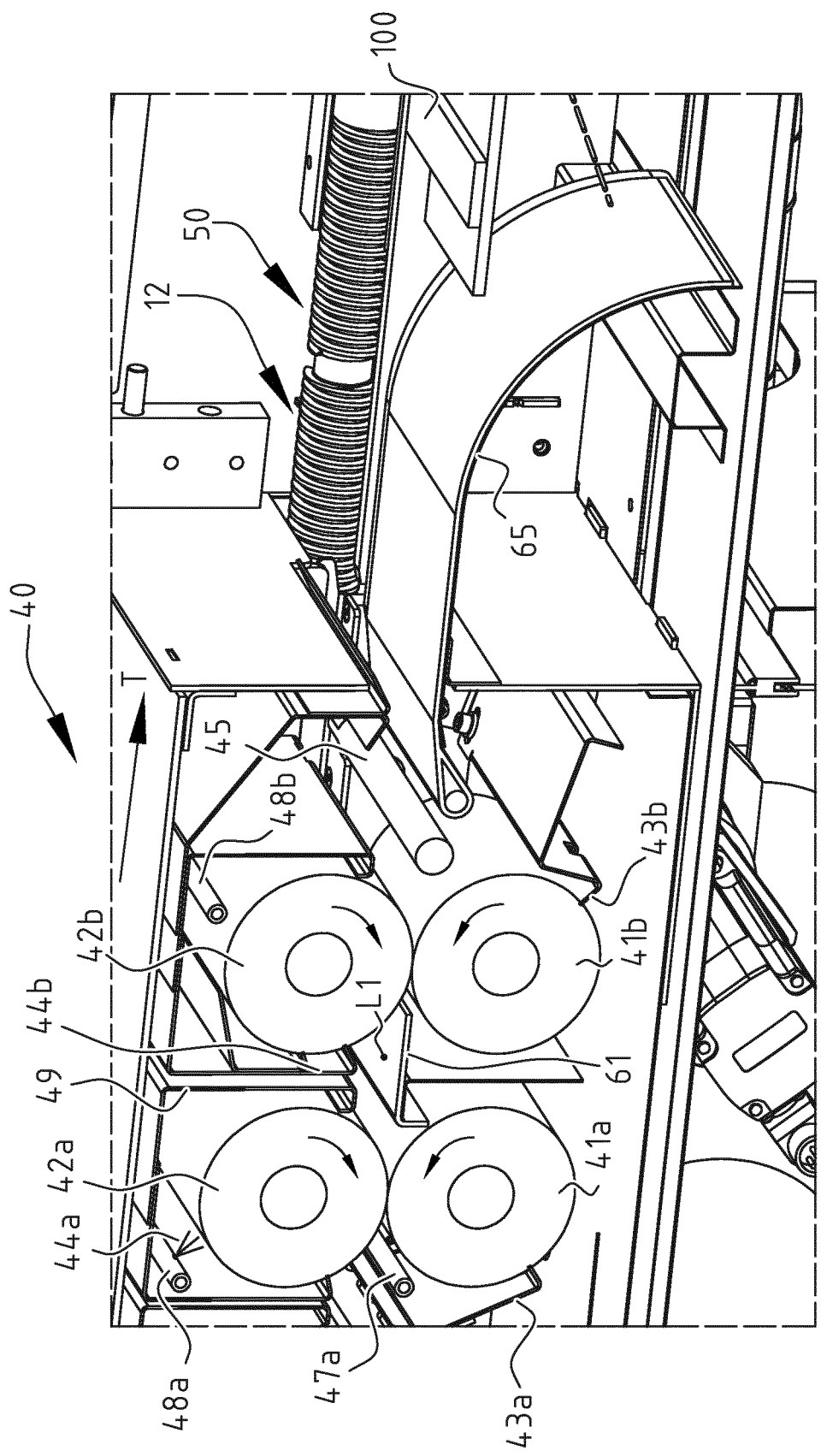
FIG. 2B is a schematic perspective view of the removal means of the exemplary embodiment of FIG. 1A.
Figure 2C:
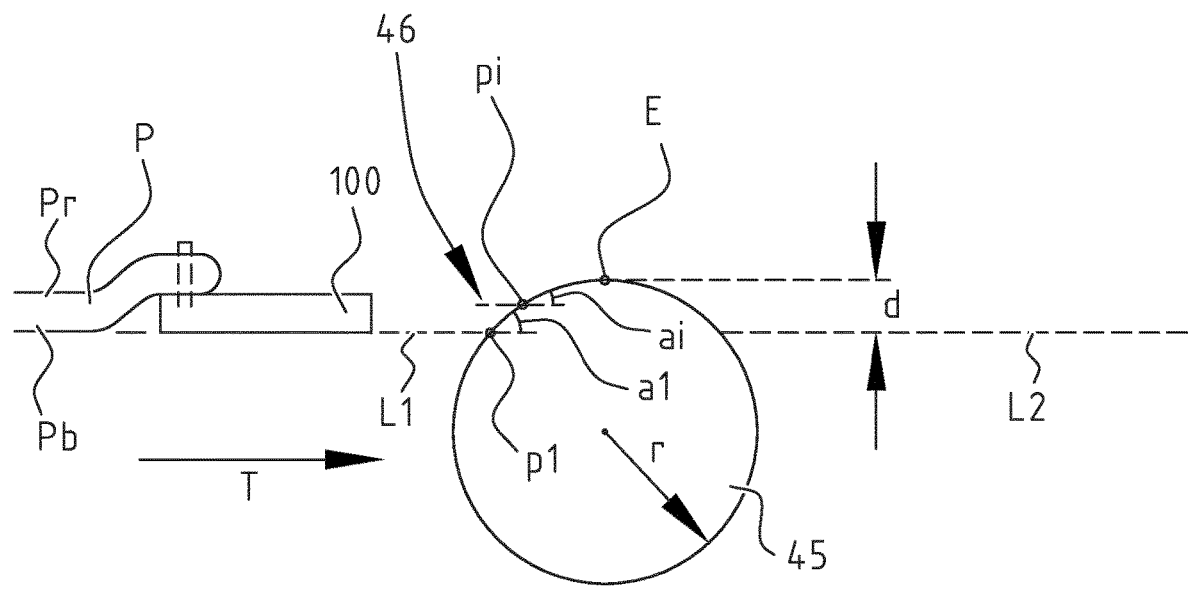
FIGS. 2C and 2D are schematic views of the liquid removal and guidance body shown in FIGS. 2A and 2B.
Figure 2D:
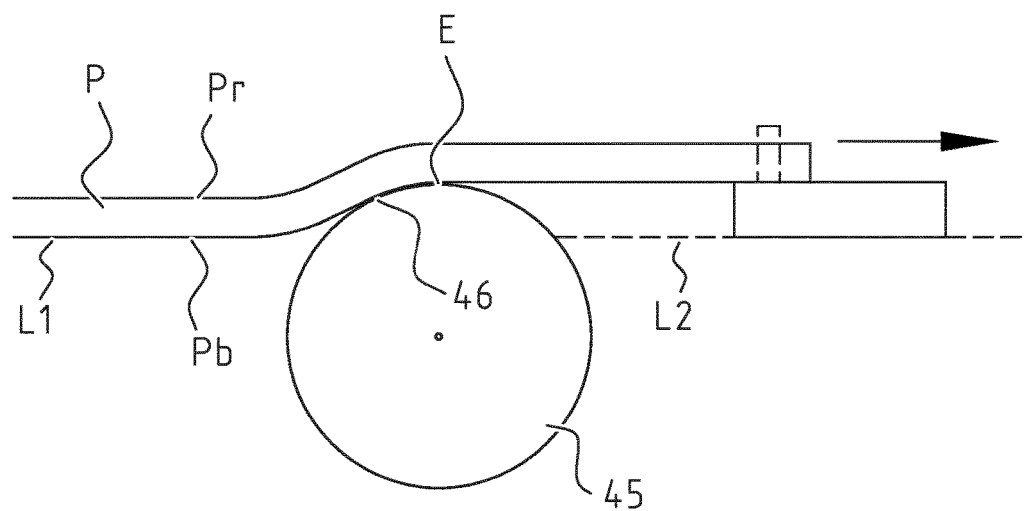

The relief precursor P has a back side Pb and a relief side Pr, see e.g. FIG. 1B and FIGS. 2C and 2D. The treating means 30 is configured for treating the relief side Pr and/or the back side Pb of the relief precursor P. The treating means 30 may comprise any one or more of the following: rotating treating means, oscillating treating means, spraying means, rinsing means, or combinations thereof; and more in particular cylindrical rotating brushes, flat rotating brushes, oscillating cylindrical or flat brushes, or combinations thereof.

The removal means 40 is shown in more detail in FIGS. 2A-2D. The removal means 40 comprises at least one upper removal roll 42a, 42b arranged to rotate in contact with the relief side Pr of the relief precursor P, at least one lower removal roll 41a, 41b arranged to rotate in contact with the back side Pb of the relief precursor P, and a liquid removal and guidance body 45 mounted for removing liquid from the back side Pb of the relief precursor. The liquid removal and guidance body 45 is arranged downstream of the at least one lower removal roll 41a, 41b. Each upper removal roll 42a, 42b is arranged opposite each lower removal roll 41a, 41b, on opposite sides of a first transport level L1. In the illustrated embodiment two roll pairs are provided. The relief precursor P first passes through the first roll pair 41a, 42a such that the back side Pb is brushed and cleaned by the lower roll 41a and that the relief side Pr is brushed and cleaned by the upper roll 42a. This first roll pair 41a, 42a will entail a first debris removal. Next, the relief precursor P passes through the second roll pair 41b, 42b such that the back side Pb is further brushed and cleaned by the lower roll 41b and that the relief side Pr is further brushed and cleaned by the upper roll 42b, causing a further debris removal. Each lower and upper removal roll 41a, 41b, 42a, 42b may be provided with a doctor blade 43a, 43b, 44a, 44b such that in operation debris is removed from the rotating removal rolls. The at least one lower and/or upper removal roll 41a, 41b, 42a, 42b may comprise a brush roll and/or a cloth roll. For example, the second roll pair 41b, 42b may have softer brushes than the first roll pair 41a, 42a. Optionally, the removal means 40 further comprises a liquid application means 47a, 48a, 48b to apply additional liquid, e.g. by spraying, on the at least one upper and/or lower removal roll 41a, 42a, 42b in order to promote the removal of debris from the relief precursor P, see FIG. 2B. The liquid application means 47a, 48a, 48b may be embodied as tubes with spray holes. Further intermediate wall portions 49 may be provided to avoid that drops fly around in the housing.

The liquid removal and guidance body 45 is provided with an upper surface 46 which runs upwardly in the transport direction T to a top edge E above the first transport level L1, see FIG. 2C, such that the relief precursor P is lifted upward when passing over the upper surface 46. In that manner liquid will be removed from the back side Pb and will flow along the upper surface 46. In fact the liquid removal and guidance body 45 has a wiping function, wiping any remaining liquid from the back side Pb of the relief precursor P. In the illustrated embodiment of FIG. 1A and FIGS. 2A-2D, the liquid removal and guidance body 45 is shaped as a rod and comprises an elongate body extending in a direction substantially perpendicular on the transport direction T and parallel to the first transport level L1. The elongate body 45 is configured and mounted to be in contact with substantially the entire width of the relief precursor P, when a relief precursor P passes along the liquid removal and guidance body 45. The elongate body 45 is preferably stationary. Optionally, the elongate body 45 may be spring-mounted such that it is pushed against the relief precursor P, but it is not rotatably mounted. The liquid removal and guidance body 45 may be provided with a reservoir (not shown) arranged for collecting liquid removed by the liquid removal and guidance body 45.

Preferably, the upper surface 46 which is in contact with the relief precursor is an inclined surface which inclines upwardly under a relatively small angle. Preferably, the angle at the top edge E of the upper surface is smaller than 60°, more preferably smaller than 45°, even more preferably smaller than 20°. In the illustrated example of FIGS. 2A-2D, the liquid removal and guidance body 45 is a bar having a circular cross section, so that the angle is zero at the top edge E of the upper surface 46. More in particular, the angle gradually decreases from a1 at a first line p1 of surface 46 (at the first transport level L1), to an angle a2 in at second line p2 of surface 46, to zero at the top edge E of the surface 46. The upper surface 46 may be curved and have a rounded upper edge (see top edge E). Preferably, the radius of curvature r of the rounded upper edge is in the range of 0.1 to 20 mm, preferably 5 to 15 mm.

Preferably, the distance d between the top edge E and the first transport level L1, see FIG. 2C, is in the range of 0.1 to 10 mm, preferably 0.5 to 8 mm, more preferably 0.5 to 5 mm, most preferably 1 to 5 mm.

The elongate body 45 may be made of a corrosion and/or solvent resistant material. For example, the elongate body 45 may be made of a metal, such as a stainless steel, a polymer, a polymer blend, a rubber, a ceramic, a glass or combinations thereof.

The first transport level L1 extends in a horizontal plane. The relief precursor P may be partially supported by tables 60, 61, when entering, passing through, and leaving the removal means 40. The relief precursor may be pulled with a relatively high force through the apparatus, e.g. a force of more than 1000 N, typically more than 2000 N. In that manner, the relief precursor P will be tensioned which may increase the efficiency of the liquid removal by the rod 45.

Figure 3A:
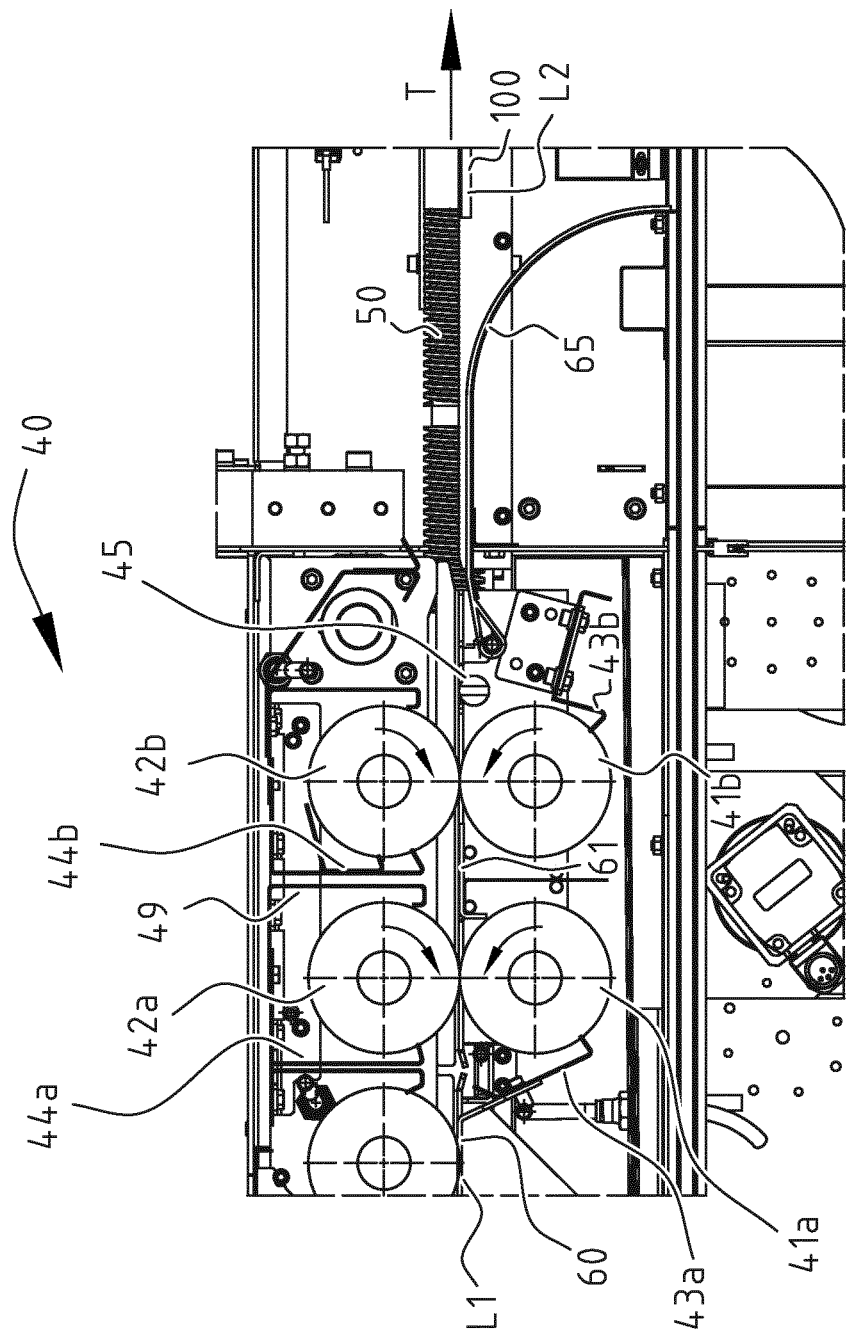
FIG. 3A is a detailed side view of another exemplary embodiment of the removal means.
Figure 3B:
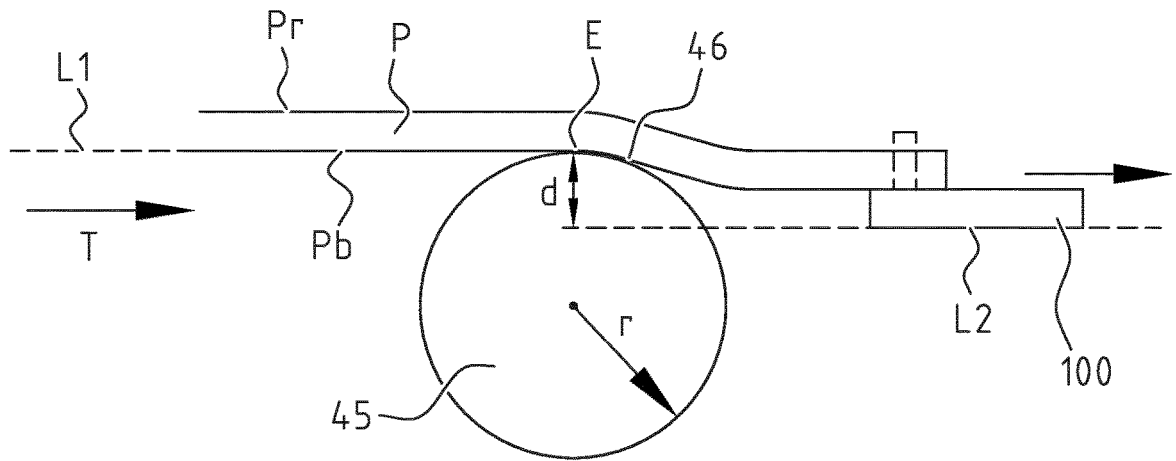
FIG. 3B is a schematic view of the liquid removal and guidance body shown in FIG. 3A.

FIGS. 3A and 3B illustrate another exemplary embodiment of a possible removal means 40. Similar components have been indicated with the same reference numerals, and reference is made to the description above. Here, the top edge E is at the same level as the first transport level, but a second transport level L2 downstream of the liquid removal and guidance body 45 is lower than the top edge E. The upper surface 46 which is in contact with the relief precursor P is an inclined surface which inclines downwardly under a relatively small angle. Preferably, the angle at the top edge E of the upper surface is smaller than 60°, more preferably smaller than 45°, even more preferably smaller than 20°. In the illustrated example of FIGS. 3A and 3B, the liquid removal and guidance body 45 is a bar having a circular cross section, so that the angle is zero at the top edge E of the upper surface 46. Preferably, the distance d between the top edge E and the second transport level L2, see FIG. 3B, is in the range of 0.1 to 10 mm, preferably 0.5 to 8 mm, more preferably 0.5 to 5 mm, most preferably 1 to 5 mm. The upper surface 46 may be curved and have a rounded upper edge (see top edge E). Preferably, the radius of curvature r of the rounded upper edge is in the range of 0.1 to 20 mm, preferably 5 to 15 mm.

Figure 4:
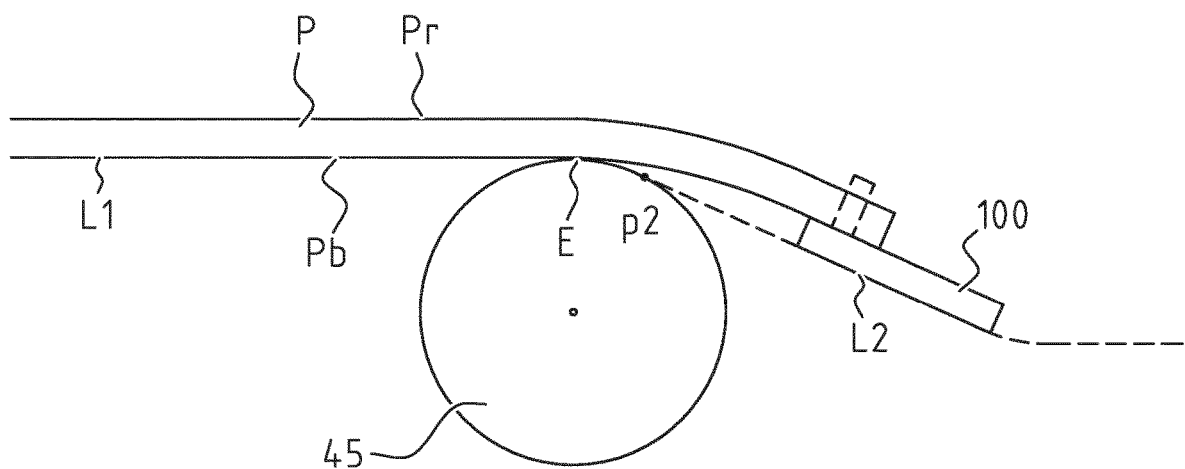
FIG. 4 is a schematic view of another exemplary embodiment of the liquid removal and guidance body.

FIG. 4 illustrates yet another possible embodiment, which is similar to the embodiment of FIG. 3B, but where the transport bar 100 with coupled relief precursor P is transported at a second transport level L2 which is downwardly inclined immediately after the liquid removal and guidance body 45. The skilled person understands that many alternatives are possible as long as the relief precursor is pulled over and against the liquid removal and guidance body 45.

Optionally, the apparatus may comprise adjustment means (not shown) configured for adjusting the elevation level of the upper surface 46 of the liquid removal and guidance body 45. Preferably, the apparatus comprises a control means 800, see FIG. 1B, configured to control one or more of the conveying mechanism 50, the treating means 30, the adjustment means (not shown) and the removal means 40.

As is schematically illustrated in FIG. 1B, the apparatus 1000 may comprise a conveying mechanism 50 with at least one, preferably at least two, and even more preferably at least three transport bars 100 intended to be coupled to a relief precursor P. The transport bar 100 is coupled to a leading edge 3 of the relief precursor P and preferably extends over more than the entire length of the leading edge 3, such that end parts of the transport bar 100 can be coupled to the conveying mechanism 50. It is noted that it is also possible to couple a plurality of relief precursors P to the transport bar 100. Preferably, the length of the transport bar 100 is between 100 mm and 1000 mm, more preferably between 1000 mm and 4000 mm. Note that the transport bar 100 is also shown in the embodiment of FIGS. 2A-2D and 3A-3B.

The apparatus 1000 of FIG. 1B further comprises a plate coupling station 300 configured for coupling a relief precursor P to a transport bar 100, a housing 10 with treating means 30 (not shown) and removal means 40 (not shown) configured for treating the relief precursor P with at least one liquid and removing liquid, respectively, whilst the transport bar 100 to which the relief precursor P is coupled, is moved through the housing 10, and a plate decoupling station 500 configured for decoupling the treated relief precursor P from the transport bar 100. Optionally, the conveying mechanism 50 may be part of a transport system 50, 230 which is configured to automatically move each transport bar 100, after being coupled to a relief precursor P in the plate coupling station 300, from the plate coupling station 300 through the housing 10 to the plate decoupling station 500, and, after being decoupled from a treated relief precursor P, from the plate decoupling station 500 back to the plate coupling station 300, such that the transport bar 100 moves in a closed loop through the apparatus 1000. In the illustrated example of FIG. 1B, four transport bars 100 circulate in the apparatus 1000.

Figure 8A:
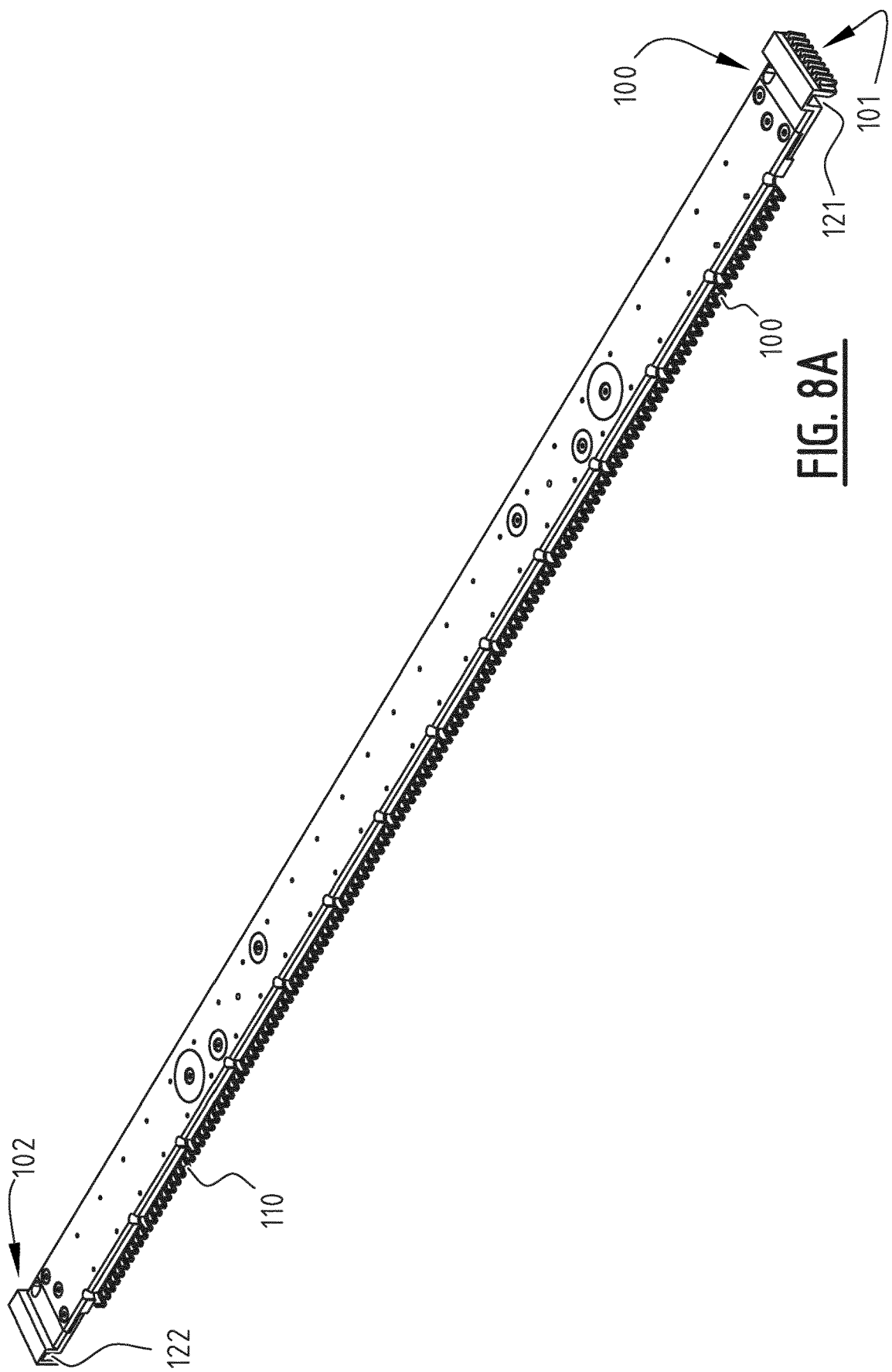
FIGS. 8A and 8B illustrate perspective views of an exemplary embodiment of a transport bar and lead screw suitable for use in embodiments of the invention.
Figure 8B:
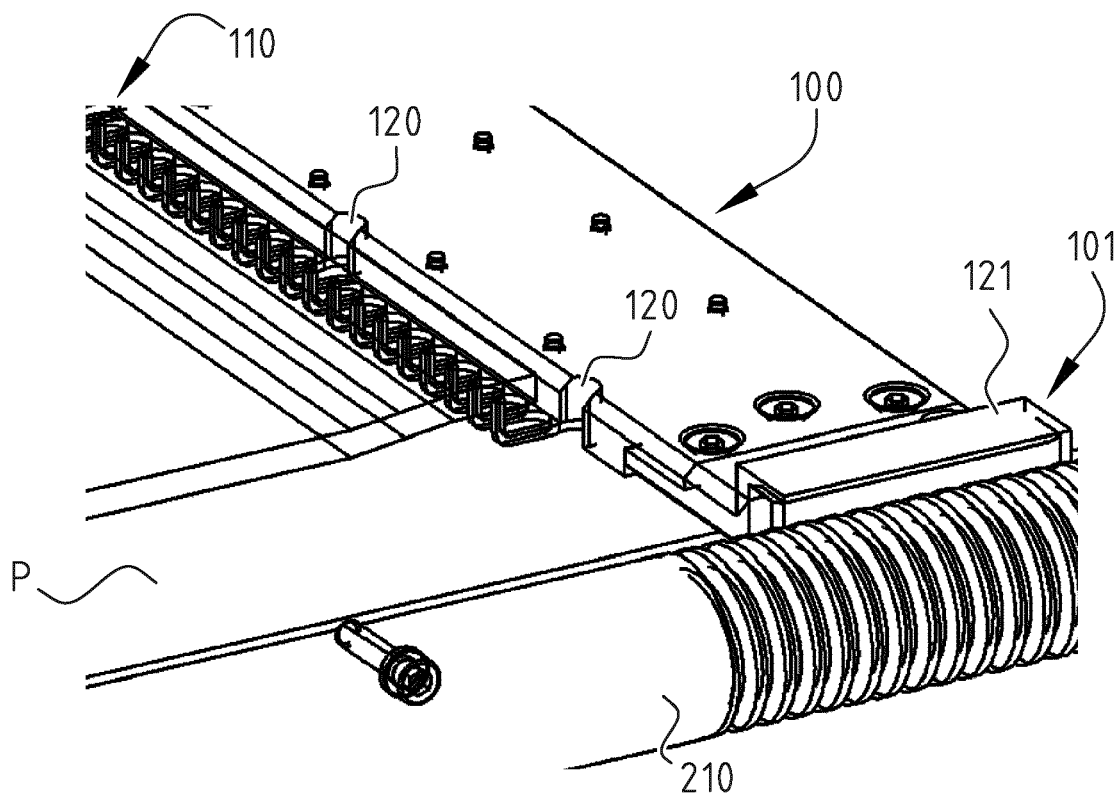

An exemplary embodiment of a transport bar 100 is shown in detail in FIG. 8A, and FIG. 8B shows how the transport bar 100 may be coupled to a first lead screw 210. The transport bar 100 has a first end 101 provided with a first coupling portion 121 configured to be coupled to the first lead screw 210, and a second end 102 with a second coupling portion 122 configured to be coupled to a second lead screw. However, in other embodiments, the first and/or second forward transport mechanism 210, 220 may comprise other transport means such as a chain or belt, and the first and second coupling portions 121, 122 may be adapted accordingly. In a preferred embodiment, each transport bar 100 is provided with a plurality of penetration elements 110 (here in the form of pins or rods), and the plate coupling station 300 is configured to engage the plurality of penetration elements 110 in an area near the leading edge 3 of the relief precursor P. In FIG. 1B, the relief precursor P has a leading edge 3, a trailing edge 4, both perpendicular to a forward transport direction T of the relief precursor P through the apparatus 1000, and two side edges 1, 2 parallel to the forward transport direction T. An area near the leading edge 3 of the relief precursor P is coupled to the plurality of penetration elements 110 of the transport bar 100.

The housing 10 has an entrance port 11 and an exit port 12. A transport bar 100 with a coupled relief precursor P is moved through the housing 10 from the entrance port 11 to the exit port 12, wherein the transport bar 100 moves in the transport direction T. Between the exit port 12 and the plate decoupling station 500, there may be provided a plate discharge zone 600. A relief precursor P is pulled at the second transport level L2 by the conveying mechanism 50 fully out of the housing 10 in the plate discharge zone 600 before being decoupled from the transport bar 100 in the decoupling station 500. There may be provided a guidance surface 65 (see FIGS. 2A, 2B and 3A) for guiding a trailing edge of the relief precursor P, whilst the leading edge is being held and pulled out by the transport bar 100. When the relief precursor P is decoupled from the transport bar 100, the relief precursor P can be discharged in the plate discharge zone 600. At the bottom of the plate discharge zone 600 there may be provided a removal means configured to remove a treated relief precursor P after being decoupled from the transport bar 100 in the plate decoupling station 500. In the illustrated embodiment, the removal means 700 is a trolley configured for receiving the treated relief precursor P in the plate discharge zone 600, and for being moved out of the plate discharge zone 600, such that it can be easily transported away of the plate discharge zone. In other non illustrated embodiments, the removal means 700 may be a carrier, a robot, a moving belt, at least one rotating drum, etc. Also such devices can be configured to move a treated relief precursor P out of the plate discharge zone 600 after being decoupled in the plate decoupling station 500.

In the embodiment of FIG. 1B, the conveying mechanism 50 comprises first mechanism on one side of the apparatus 1000, and a second transport mechanism on the other side of the apparatus 1000. A first end 101 of the transport bar 100 is coupled with the first forward transport mechanism, and a second end 102 of the transport bar 100 is coupled with the second transport mechanism. Further, there is provided a backward transport mechanism 230 configured to transport the transport bar 100 from the plate decoupling station 500 back to the plate coupling station 300. In the illustrated embodiment of FIG. 1B, the backward transport mechanism 230 is located at an upper side of the apparatus 1000. However, in other embodiments, the backward transport mechanism 230 could be arranged in a lower portion of the apparatus 1000, below the conveying mechanism 50. A backward transport mechanism 230 may comprise any one of the following: one or more belts, one or more chains, one or more lead screws, a linear motor, or combinations thereof.

As illustrated in FIG. 1B, the control means 800 may be configured to control different components of the apparatus, such as the transport mechanisms 50, 230, the treating means 30, and the removal means 40. The control means 800 may control the transport mechanisms such that when one transport bar 100 of the plurality of transport bars moves through the housing 10, another transport bar 100 moves back to the plate coupling station 300. More preferably, at least three transport bars move in the system. Further, the transport speed in the transport direction T may be different from the transport speed in the backward transport direction Tb, wherein preferably the transport speed in the backward transport direction Tb is faster than in the forward transport direction T. Typically, the forward and backward transport speed is in the range from 1 mm/sec to 1000 mm/sec.

As shown in FIG. 1A, in the housing 10, the relief precursor P is pulled below brushes of the treating means 30 in order to be cleaned. The brushes may be arranged in a way that they are above the relief precursor P. Further nozzles and liquid injection means (not shown) may be provided to wash the relief precursor P whilst the brushes rotate over the relief precursor. In the illustrated embodiment, the brushes have a rotating axis arranged perpendicular on the transport direction T of the relief precursor P. However, in other embodiments, there may be provided a large number of rotating brushes mounted around a vertical rotation axis which are at least partially immersed in a liquid bath. The rotating brushes or any alternative brushes are arranged for thoroughly cleaning the relief precursor. The rotation direction of the brushes may be the same than the transport direction or opposite, preferably some rotate in the transport direction and some opposite to the transport direction. Additionally the brushes may be moved in a direction parallel to their axis (oscillating). The speed of the brushes may be varied over a broad range of speeds, e.g. in the range of 1 rpm to about 2000 rpm. In addition flat rotating or oscillating brushes may be used. Aggression may also be changed by controlling the pressure with which the brushes are contacted with the relief precursor and/or distance of the brushes to the relief precursor surface. The brushes may be the same or different and may vary in diameter, stiffness or hardness of the bristles, density of bristles, thickness of bristles, material of bristles (e.g. aluminum, stainless steel, bras, polyethylene, polyoxymethylene, polyamide (nylon), polyester or combinations thereof), arrangement of bristles (spiral or linear), length and shape (e.g. circular, elliptical or rectangular or hexagonal cross section) of bristles or combinations thereof. The strength of aggression of the brushes (high aggression relates to removal of large portions of material) may be varied by changing it from high aggression at the beginning to low aggression at the end of the process or the opposite.

The nature of the liquid used is guided by the nature of the precursor employed. If the layer to be removed is soluble, emulsifiable or dispersible in water or aqueous solutions, water or aqueous solutions might be used as first liquid in the pre-cleaning station. If the layer is soluble, emulsifiable or dispersible in organic solvents or mixtures, organic solvents or mixtures may be used as second liquid in the pre-cleaning station. If the precursor has an aqueously developable layer, then water or predominantly aqueous solvents can be used as second liquid in the developing station. In the case of organically developable precursors different organic solvents or their mixtures may be used as second liquid in the developing station. Correspondingly the post-cleaning station may be operated with water, aqueous solution, organic solvent or mixtures of organic solvents depending on the nature of the relief layer to be cleaned as a third liquid.

The liquids may be water or aqueous solutions which may contain other ingredients e.g. salts, acids, bases, emulsifiers, dispersion aids, viscosity regulators, surfactants or combinations thereof. Salts, acids and bases may be used to control the pH of the liquid. Emulsifiers and dispersion aids may be used to enhance the capacity of material uptake of the liquids and stabilize such emulsions and dispersions. The aqueous solutions may comprise organic solvents, e.g. alcohols, esters, ethers; or hydrocarbons or combinations thereof.

The liquids may be organic solvents or mixtures thereof. For example, use may be made of developers comprising naphthenic or aromatic petroleum fractions in a mixture with alcohols, such as benzyl alcohol, cyclohexanol, or aliphatic alcohols having 5 to 10 carbon atoms, for example, and also, optionally, further components, such as, for example, alicyclic hydrocarbons, terpenoid hydrocarbons, substituted benzenes such as diisopropylbenzene, esters having 5 to 12 carbon atoms, or glycol ethers, for example. Suitable washing agents are disclosed in EP-A 332 070 or EP-A 433 374, for example. In addition the solvents and solvent mixtures may comprise other ingredients e.g. salts, acids, bases, emulsifiers, dispersion aids, viscosity regulators, antistatics, water, surfactants or combinations thereof. For reasons of safety and to reduce the cost and complexity of the apparatus involved, the temperature when using organic solvents ought to be 5° C. to 15° C. beneath the flash point of the washing agent mixture used.

The treating means 30 may be a single unit using a single liquid, but can also be composed of two or more sub units which may use the same fluid or different fluids. Also the arrangement of the brushes and liquid handling systems including pumps, filters, troughs, hoses, etc. may be common or divided according to the number of subunits.

In non-illustrated embodiments, a post-treatment may be provided to perform a post-treatment on the relief precursor, e.g. further drying, post-exposure, heating, cooling, removing of material, etc.

A drying station allows the complete removal of the liquid. This may be achieved by heating or by reducing pressure or a combination of both whereby the evaporation of the liquid is accelerated. Heating may be achieved with an oven, hot gas (preferably air or steam), irradiation with IR light, irradiation with microwaves or combinations thereof. Reduction of pressure may be achieved by ventilation, vacuum pumps (e.g. diffusion pump, aspirator pump, oil pump etc.) a Venturi tube or combinations thereof. Preferably heating with IR lamps or hot air is used for the drying. Drying takes place preferably at a temperature of 40° C. to 200° C., preferably at 50° C. to 160° C., more preferably at 50° C. to 100° C., most preferably at 50° C. to 80° C. Where the dimensionally stable support of the flexographic printing element is a metal support, drying may also take place at higher temperatures, up to around 160° C.

Post exposure may be used to make the surface of the developed precursor non-tacky and/or to further cure the photo curable relief layer. In this station the developed precursor is treated with electromagnetic rays, preferably using UVA or UVC light. As light sources fluorescent lamps, LEDs or flash lamps or combinations of several of these light sources may be used. Preferably, LEDs or fluorescent lamps are installed. The light sources can be connected to a control system which steers the exposure time, the wavelength in case light sources with different emission spectra are installed, the light intensity or combinations thereof.

Further, in non-illustrated embodiments, a pre-treatment compartment may be provided to perform a pre-treatment on the relief precursor, said pre-treatment being selected from the group comprising: cutting, ablation, exposure to electromagnetic radiation, and combinations thereof. Optionally, during the post- and pre-treatment the relief precursor may remain coupled to the transport bar.

Preferably the pre-treating station comprises an ablation device, an exposure device or a combination of both. An ablation treatment comprises removing material from at least one layer. For example, material of at least one layer may be removed in accordance with image data. More in particular, the performing of a treatment may comprise any one of the following: exposure to electromagnetic waves; engraving, e.g. mechanical engraving; exposure to material jets, such as particle jets, fluid jets, gas jets; exposure to a plasma; exposure to a continuous web such as for thermal development; or combinations thereof. The electromagnetic waves may be e.g. any one of the following: broadband electromagnetic waves, narrow band electromagnetic waves, monochromatic electromagnetic waves, large area electromagnetic waves e.g. with a lamp, selective electromagnetic waves, e.g. emitted by a laser, waves emitted along the full axial length of the drum or along a portion of the axial length of the drum, continuous or pulsed electromagnetic waves, high or low energy electromagnetic waves, ablation or initiation electromagnetic waves, UV to IR electromagnetic waves. The wavelength of the electromagnetic waves may be in the range from 200 to 20000 nm, preferably in the range of 250 to 15000 nm, more preferably in the range of 300 to 11000 nm, most preferably in the range of 350 to 11000 nm. The total power of the electromagnetic radiation may range from low values which are enough to trigger a chemical reaction to high values causing fast heating and evaporation or ablation of material, e.g. in the range form 0.1 mW to 2000 W, preferably from 1 mW to 1000 W, more preferably from 5 mW to 7500 W, most preferably from 1 W to 200 W. Typically the ablating beams are moved over the surface in order to create an image e.g. by means of rotating mirrors or rotating the relief precursor on a drum.

An exposure device comprises a source for electromagnetic radiation which delivers light with the required wavelength to the relief side or back side of a relief precursor. Preferably the wavelength are in the UV-Vis region of the electromagnetic spectrum. The wavelength of the electromagnetic waves may be in the range from 200 to 800 nm, preferably in the range of 250 to 500 nm, more preferably in the range of 300 to 450 nm, most preferably in the range of 350 to 400 nm. The intensity of the electromagnetic radiation may range from 0.1 mW/cm$^2$ to 200 W/cm$^2$, preferably from 1 mW/cm$^2$ to 200 W/cm$^2$, more preferably from 10 mW/cm$^2$ to 200 W/cm$^2$. As light sources metal halide lamps, fluorescent lamps, LEDs or flash lamps or combinations of several of these light sources may be used. Preferably, LEDs or fluorescent lamps are installed. The light sources can be connected to the control system which steers the exposure time, the wavelength in case light sources with different emission spectra are installed, the light intensity or combinations thereof. The light source and the relief precursor may be stationary during exposure or may be in relative motion to each other during exposure. Preferably bar like LED arrays are moved across the relief precursor or the relief precursor is passed a LED array. Typically the exposure is performed through a mask which may be an integral part of the relief precursor or a separate mask layer or an electronically switchable mask (e.g. a display like device with switchable transparent and non-transparent regions or pixels). Scanning beams without the use of a mask may be used as well. The exposure compartment may be used under ambient conditions or in specific atmosphere e.g. with reduced oxygen content.

Figure 5:
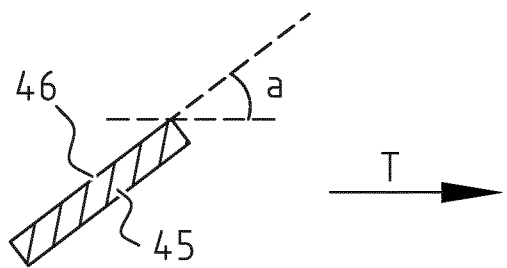
FIGS. 5-7 illustrate other exemplary embodiments of the liquid removal and guidance for use in an apparatus for treating a relief precursor.
Figure 6:
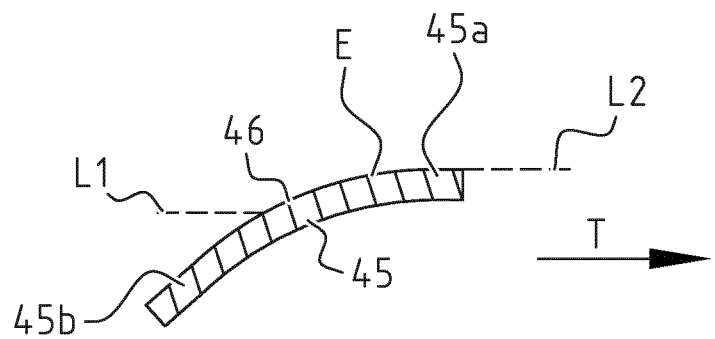
Figure 7:
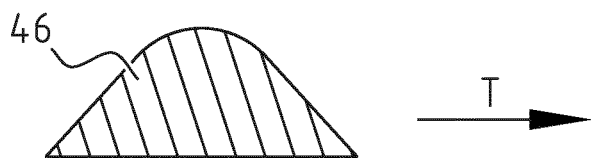

FIGS. 5-7 illustrate three further possible embodiments of elongate bodies. Generally, the elongate body 45 may be any one of the following: a rod, a bar, a plate, a blade. The cross section of the elongate body 45 may be a line, a curve, a rectangle, a triangle, a circle, a partial circle, an ellipse, a partial ellipse, a polygonal shape with at least one rounded or one sharp edge. The upper surface 46 may be a curved or a flat upper surface. In the embodiment of FIG. 6 the elongate liquid removal body 45 is a plate having a cross section in the form of a line having a first portion 45b which is at an angle with respect to a second top portion 45a. The first portion 45b is an inclined portion being oriented at an angle with respect to the first transport level L1, and the second portion extends in a horizontal plane, at a level E above the first transport level L1 and/or above the second transport level L2. In the embodiment of FIG. 4 the elongate liquid removal body 45 is a flat plate arranged at an angle with respect to a horizontal first and second transport level L1, L2, such that it functions as a wiping blade. In the embodiment of FIG. 6 the elongate liquid removal body 45 has a substantially triangular cross section with a rounded top edge.

In the embodiments illustrated above the task of the liquid removal body 45 is to remove liquid from the back side Pb of the relief precursor P, preferably without causing scratches. In that manner, the drying time can be reduced and removed liquid can be collected. This has the further advantage of having less VOCs during a further drying step. Compared to other liquid removal techniques, embodiments of the invention have the advantage of being simple and robust without the need for additional complex mechanical mechanisms and without having to use absorbing materials.

A relief precursor generally comprises a support layer made of a first material and an additional layer made of a second material which is different from said first material. The support layer may be a flexible metal, a natural or artificial polymer, paper or combinations thereof. Preferably the support layer is a flexible metal or polymer film or sheet. In case of a flexible metal, the support layer could comprise a thin film, a sieve like structure, a mesh like structure, a woven or non-woven structure or a combination thereof. Steel, copper, nickel or aluminium sheets are preferred and may be about 50 to 1000 µm thick. In case of a polymer film, the film is dimensionally stable but bendable and may be made for example from polyalkylenes, polyesters, polyethylene terephthalate, polybutylene terephthalate, polyamides und polycarbonates, polymers reinforced with woven, non-woven or layered fibres (e.g. glass fibres, Carbon fibres, polymer fibres) or combinations thereof. Preferably polyethylene and polyester foils are used and their thickness may be in the range of about 100 to 300 µm, preferably in the range of 100 to 200 µm.

A relief precursor may carry an additional layer. For example, the additional layer may be any one of the following: a direct engravable layer (e.g. by laser), a solvent or water developable layer, a thermally developable layer, a photosensitive layer, a combination of a photosensitive layer and a mask layer. Optionally there may be provided one or more further additional layers on top of additional layer. Such one or more further additional layers may comprise a cover layer at the top of all other layers which is removed before the imageable layer is imaged. The one or more additional layers may comprise a relief layer, and an antihalation layer between the support layer and the relief layer or at a side of the support layer which is opposite of the relief layer. The one or more additional layers may comprise a relief layer, an imageable layer, and one or more barrier layers between the relief layer and the imageable layer which prevent diffusion of oxygen. Between the different layers described above one or more adhesion layers may be located which ensure proper adhesion of the different layers.

In a preferred embodiment the relief precursor comprises a photosensitive layer and a mask layer. The mask layer may be ablated or changed in transparency during the pre-treatment and forms a mask with transparent and non-transparent areas. Underneath of transparent areas of the mask the photosensitive layer undergoes a change in solubility and/or fluidity upon irradiation. The change is used to generate the relief by removing parts of the photosensitive layer in one or more subsequent steps. The change in solubility and/or fluidity may be achieved by photo-induced polymerization and/or crosslinking, rendering the irradiated areas less soluble and less meltable. In other cases the electromagnetic radiation may cause breaking of bonds or cleavage of protective groups rendering the irradiated areas more soluble and/or meltable. Preferably a process using photo-induced crosslinking and/or polymerization is used.

Whilst the principles of the invention have been set out above in connection with specific embodiments, it is to be understood that this description is merely made by way of example and not as a limitation of the scope of protection which is determined by the appended claims.

The invention claimed is:

1. An apparatus for treating a relief precursor having a back side and a relief side, said apparatus comprising:
   a housing,
   at least one compartment to hold at least one liquid,
   a treating means for treating the relief precursor with the at least one liquid, said treating means being arranged in the housing,
   a removal means for removing debris and/or liquid from the relief precursor, said removal means being arranged downstream of the treating means, and
   a conveying mechanism configured for transporting the relief precursor in a transport direction through the housing,
   wherein the removal means comprises a liquid removal and guidance body mounted for removing liquid from the back side of the relief precursor, said conveying mechanism being configured for pulling said relief precursor over and against said liquid removal and guidance body whilst the relief precursor is moved in the transport direction, such that in operation liquid is removed from the back side,
   wherein the conveying mechanism is configured for transporting the relief precursor at a first transport level upstream of the liquid removal and guidance body and at a second transport level downstream of the liquid removal and guidance body, wherein the first and the second transport level may be the same or different, wherein at least one of the first and second transport level is lower than a top edge of the liquid removal and guidance body such that in operation, the relief precursor moves upwardly when arriving at the liquid removal and guidance body and/or downwardly when leaving the liquid removal and guidance body.

2. The apparatus according to claim 1, wherein the liquid removal and guidance body is arranged to be substantially stationary when in operation.

3. The apparatus according to claim 1, wherein the liquid removal and guidance body is an elongated body made of a metal.

4. The apparatus according to claim 1, wherein the conveying mechanism is provided with a transport bar configured to be coupled to a leading edge of the relief precursor, and wherein the conveying mechanism is configured to pull the transport bar with the coupled relief precursor over the liquid removal and guidance body.

5. The apparatus according to claim 1, wherein the liquid removal and guidance body extends in a direction substantially perpendicular on the transport direction and parallel to a transport plane of the relief precursor through the housing.

6. The apparatus according to claim 1, wherein the liquid removal and guidance body is configured and mounted to be in contact with substantially the entire width of the relief precursor.

7. The apparatus according to claim 1, wherein the liquid removal and guidance body is any one of a rod, a bar, a plate, and a blade; and wherein the roughness of a top surface of the liquid removal and guidance body is lower than Ra 3.5 μm.

8. The apparatus according to claim 1, wherein a top surface of the liquid removal and guidance body is curved and has a rounded upper edge, and the radius of curvature of the rounded upper edge is in the range of 0.1 to 20 mm.

9. The apparatus according to claim 1, wherein the relief precursor is a printing plate precursor, wherein the removal means further comprises at least one lower removal roll arranged to rotate in contact with the back side of the relief precursor, said at least one lower removal roll being arranged upstream of the liquid removal and guidance body, wherein the at least one lower removal roll comprises a brush roll and/or a cloth roll, and wherein the at least one lower removal roll is provided with a doctor blade to remove debris and/or liquid therefrom.

10. The apparatus according to claim 1, wherein the relief precursor is a printing plate precursor, wherein the removal means further comprises at least one upper removal roll arranged to rotate in contact with the relief side of the relief precursor, said at least one upper removal roll being arranged upstream of the liquid removal and guidance body, wherein the at least one upper removal roll comprises a brush roll and/or a cloth roll; and wherein the at least one upper removal roll is provided with a doctor blade to remove debris and/or liquid therefrom.

11. The apparatus according to claim 1, further comprising adjustment means configured for adjusting an elevation level of the liquid removal and guidance body.

12. The apparatus according to claim 1, wherein the removal means further comprises a reservoir arranged for collecting liquid removed by the liquid removal and guidance body.

13. An apparatus for treating a relief precursor having a back side and a relief side, said apparatus comprising:
a housing,
at least one compartment to hold at least one liquid,
a treating means for treating the relief precursor with the at least one liquid, said treating means being arranged in the housing,
a removal means for removing debris and/or liquid from the relief precursor, said removal means being arranged downstream of the treating means, and
a conveying mechanism configured for transporting the relief precursor in a transport direction through the housing,
wherein the removal means comprises a liquid removal and guidance body mounted for removing liquid from the back side of the relief precursor, said conveying mechanism being configured for pulling said relief precursor over and against said liquid removal and guidance body whilst the relief precursor is moved in the transport direction, such that in operation liquid is removed from the back side,
wherein a top surface of the liquid removal and guidance body slopes upwardly in the transport direction between a first line and the top edge and/or slopes downwardly in the transport direction between the top edge and a second line such that in operation liquid is guided away via the top surface of the removal and guidance body.

14. The apparatus according to claim 13, wherein the conveying mechanism is configured to pull the relief precursor in a tensioned state through the housing and over the liquid removal and guidance body.

15. An apparatus for treating a relief precursor having a back side and a relief side, said apparatus comprising:
a housing,
at least one compartment to hold at least one liquid,
a treating means for treating the relief precursor with the at least one liquid, said treating means being arranged in the housing,
a removal means for removing debris and/or liquid from the relief precursor, said removal means being arranged downstream of the treating means, and
a conveying mechanism configured for transporting the relief precursor in a transport direction through the housing,
wherein the removal means comprises a liquid removal and guidance body mounted for removing liquid from the back side of the relief precursor, said conveying mechanism being configured for pulling said relief precursor over and against said liquid removal and guidance body whilst the relief precursor is moved in the transport direction, such that in operation liquid is removed from the back side,
wherein the cross section of the liquid removal and guidance body is a line, a curve, a rectangle, a triangle, a circle, a partial circle, an ellipse, a partial ellipse, or a polygonal shape with at least one rounded or one sharp edge; and/or wherein a top surface of the liquid removal and guidance body is a curved or a flat surface.

* * * * *